United States Patent [19]
Dietrich et al.

[11] Patent Number: 6,097,629
[45] Date of Patent: Aug. 1, 2000

[54] NON-VOLATILE, STATIC RANDOM ACCESS MEMORY WITH HIGH SPEED STORE CAPABILITY

[75] Inventors: Daryl G. Dietrich; Paul F. Ruths, both of Woodland Park; Christian E. Herdt, Monument, all of Colo.

[73] Assignee: Simtek Corporation, Colorado Springs, Colo.

[21] Appl. No.: 09/164,531

[22] Filed: Sep. 30, 1998

[51] Int. Cl.[7] .................................................. G11C 11/40
[52] U.S. Cl. ..................................... 365/185.07; 365/154
[58] Field of Search ............................. 365/154, 185.07, 365/156, 228

[56] References Cited

U.S. PATENT DOCUMENTS

| | | | |
|---|---|---|---|
| 5,065,362 | 11/1991 | Herdt et al. | 365/154 |
| 5,311,470 | 5/1994 | Atsumi et al. | 365/185.07 |
| 5,523,971 | 6/1996 | Rao | 365/185.07 |

*Primary Examiner*—Vu A. Le
*Attorney, Agent, or Firm*—Home Roberts & Owen LLP

[57] ABSTRACT

The invention relates to a non-volatile, static random access memory (nvSRAM) device that is capable of high speed copying of the data in the static random access portion of the device into the non-volatile portion of the device after the detection of possible loss of power. This is accomplished by preparing the non-volatile portion for receiving a bit of data from the SRAM portion before the possible loss of power is detected, i.e., pre-arming the device. In one embodiment, the pre-arming is accomplished by erasing the non-volatile portion during the time when the power supply is stable and data can be transferred between the SRAM portion and the exterior environment. In another embodiment, pre-arming is accomplished by erasing the non-volatile portion immediately after power has been provided to the device and data from the non-volatile portion has been copied into the SRAM in a recall operation. Another aspect of the invention provides for the decoupling of the erase and store operations. This facilitate, for example, the erase of the data in the non-volatile portion of the nvSRAM without a subsequent copying of data in the SRAM portion into the non-volatile portion.

19 Claims, 4 Drawing Sheets

NON-VOLATILE, STATIC RANDOM ACCESS MEMORY WITH HIGH SPEED STORE CAPABILITY

FIELD OF THE INVENTION

The present invention relates to a non-volatile, static random access memory (nvSRAM).

BACKGROUND OF THE INVENTION

In general, a computer system is comprised of a memory for holding data and programs, a processor for executing the programs or operating on the data held in memory, and an input/output device for facilitating communications between the computer system and a user. There are several different types of digital memories available for use in the memory portion of a computer system. In many instances, the particular application in which the computer system is intended to be used dictates the type of memory that is appropriate for all or a portion of the memory of the computer system. For instance, one application for a computer system in which an nvSRAM may be appropriate is in a portable computer system. Portable computer systems are generally designed to operate, if needed, with power supplied by a battery housed within the system. If the battery becomes incapable of providing power to the system and an alternative source of power is not available, the data held in memory could become irretrievably lost. In such applications, it is desirable to use an nvSRAM because the static random access memory (SRAM) portion is capable of retaining the data while power is present and providing the performance needed during normal operations, and the non-volatile memory (nv) portion is capable of retaining data for an extended period of time after power has been removed and once power is restored, reestablishing the data in the SRAM portion.

A basic nvSRAM memory device is comprised of (1) a plurality of nvSRAM memory cells; and (2) a controller for managing the operations of the nvSRAM memory cells. The nvSRAM cell is comprised of a static random access memory cell and a nonvolatile memory cell. Briefly, the terms "random access memory" and "RAM" refer to the ability to access any one of a plurality of cells in the memory at any time to write/read data to/from the accessed cell. In contrast, other types of memory require that other memory locations be traversed before the desired memory location can be accessed. These types of memories (magnetic tape, for example) are typically much slower than a random access memories. The term "static" refers to the ability of the memory to retain data as long as power is being supplied. In contrast, the term "dynamic" refers to memories that retain data as long as power is being supplied and the memory is periodically refreshed. The term non-volatile refers to the ability of a memory cell to retain data in the absence of power.

The SRAM memory cell in an nvSRAM cell is capable of communicating a bit of data to and from an exterior environment. Additionally, the SRAM memory cell can provide the nv memory cell with a copy of the bit of data, thereby providing backup storage to the SRAM cell in the event power is removed from the nvSRAM cell. The SRAM cell, as long as power is being provided, is capable of: (1) receiving a bit of data from an exterior environment; (2) retaining the bit of data; and (3) transmitting the bit of data back to the exterior environment. If, however, power is removed from the SRAM memory cell, the SRAM memory cell will lose the bit of data. The nv cell prevents this by loss by providing a backup to the SRAM memory cell. In backing up the SRAM memory cell, the nv memory cell provides the ability to: (1) receive a copy of the bit of data stored in the SRAM memory cell; (2) retain the bit of data in the absence of power being provided to the nvSRAM memory cell; and (3) return the bit of data to the SRAM cell when power is present. The copying of a bit of data from the SRAM memory cell into the nv memory cell is referred to as a store operation. The store operation has two phases, an erase phase and a program phase. In the erase phase, the nv memory cell is conditioned so that it can accept a copy of the bit of data presently retained in the SRAM memory cell. The program phase involves copying the bit of data in the SRAM memory cell to the nv memory cell. Returning a previously copied bit of data from the nv memory cell to the SRAM memory cell is referred to as a recall operation.

SUMMARY OF THE INVENTION

It has been found that the time required to perform a store operation is considered too long for certain applications. To reduce the time needed for a store operation, the present invention recognized that the erase phase of the present store operation can be accomplished prior to the detection of a possible loss of power, rather than after this detection, as is presently done. By performing the erase phase before a possible loss of power is detected, the store operation is reduced to the program phase. Stated differently, the nvSRAM of the present invention is pre-armed or made ready for the program phase before the detection of a potential power loss. Since the erase phase is no longer a part of the store operation that occurs upon the detection of a loss of power, it is hereinafter referred to as an erase operation to reflect this separate status.

In one embodiment, the controller is designed to issue the erase signals to the nvSRAM memory cell after the recall operation that occurs upon power being provided to the cell. To reiterate, the recall operation causes a bit of data that has been previously stored in the non-volatile portion of the cell to be transferred back to the SRAM portion where the bit is externally accessible. Once this recall operation has been completed and prior to the detection of a potential loss of power, the controller issues the signals to the nvSRAM to erase the non-volatile portion.

The issuing of erase operation related signals to the nvSRAM memory cell by the controller can occur at a number of points prior to the detection of a potential loss of power and subsequent to the recall operation. In one embodiment, the controller causes the erase operation to occur during the same time that a bit of data can be transferred between the SRAM portion and the exterior environment. An advantage of conducting the erase operation during this time period is that the power supply is considered to be stable. The stability of the power supply, in turn, makes its likely that the erase operation will be successfully completed.

In another embodiment, the controller issues erase operation signals to the nvSRAM memory cell prior to the detection of a potential loss of power, subsequent to the recall operation and prior to the transfer of a bit of data between the SRAM portion and the exterior environment. The controller issues the erase operation signals immediately after the completion of the recall operation when the power supply is largely considered to be stable. Alternatively, the erase operation signals are issued by the controller at a later point in time when the controller is more certain that the power supply is stable but prior to permitting the transfer of data between the SRAM portion and the exterior environment.

The invention is particularly useful in portable computing devices, such as lap top computers, in which the nvSRAM is powered with a low voltage power supply. The use of low voltage power supply, such as three volt supply, is expected to become commonplace as: (1) the demand for higher density memory devices increases; and (2) the demand for lower power consumption by all integrated circuits increases. Lower power consumption by the nvSRAM devices has the potential advantages of extending the time during which these computing device can operate on a battery and/or allow an integration of greater functionality into the computing device. However, the use of low voltage power supplies typically decreases the available time relative to the available power supply voltage for providing a copy of the bit of data in the SRAM portion to the non-volatile portion of the nvSRAM. The present invention addresses this reduction in available time by pre-arming the nvSRAM so that upon the detection of a potential loss of power, the copy of the bit of data in the SRAM is provided to the non-volatile memory within a relatively short amount of time, typically less than 2 ms.

Also provided is an nvSRAM that provides for independent erase and/or store operation. Stated differently, the nvSRAM provides for the decoupling of the erase and store operations, i.e., permitting one or the other of these operations to be independently performed. To elaborate, presently a store operation necessarily follows an erase operation. In certain applications, an erase operation without a subsequent store operation is desirable. For example, in certain security or confidential information type applications, it is desirable to erase the data in the nv cell and use a loss of power to erase any data in the SRAM cell to prevent any data in either the nv cells or SRAM cells from coming into the possession of certain parties. Consequently, an nvSRAM device is provided that permits an independent erase operation to be performed. The independent erase operation is performed in response to a request received by the controller of the nvSRAM device. Further, the controller is capable of causing the independent erase operation to be performed at substantially any point after a power-up recall operation. Consequently, the independent erase operation can be accomplished prior to the period of time during which SRAM operations a re possible, during the time SRAM operations are possible, and upon the detection of a loss of power. In the event that an independent erase operation has been performed, a subsequent store operation is not precluded. Consequently, a further embodiment of the nvSRAM provides for an independent store operation following an independent erase operation. The independent store operation is performed in response to a request received by the controller of the nvSRAM device. The periods of time after a power-up recall operation during which the independent store operation can be performed are limited to times during which an SRAM operation is not occurring and after a power loss has been detected.

An independent store operation that is completely independent of an erase operation or prior to an erase operation is also feasible.

DETAILED DESCRIPTION

Figure 1:
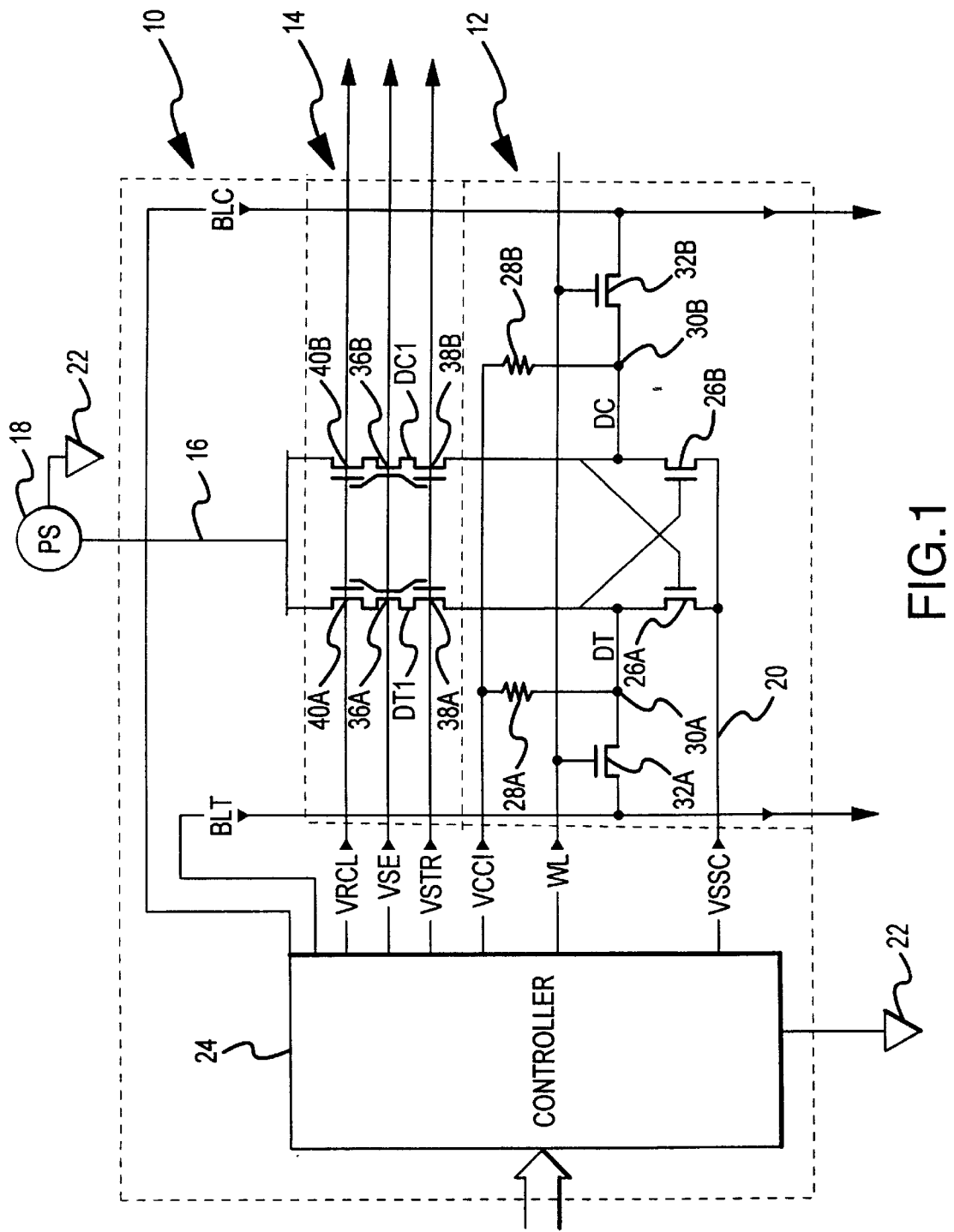
FIG. 1 illustrates an nvSRAM device that includes a memory cell comprised of a static random access memory (SRAM) cell and a non-volatile memory (nv) cell, and a controller for managing the transfer of a bit of data between the SRAM cell and the nv cell.

FIG. 1 illustrates an nvSRAM device with high speed store capability 10, hereinafter referred to as nvSRAM device 10. While the nvSRAM device 10 is illustrated as having a single memory cell to simplify the discussion of the invention, it should be appreciated that an nvSRAM device typically includes a plurality of nvSRAM cells that are integrated with a controller onto a semiconductor chip.

The nvSRAM device 10 includes an SRAM 12 cell that is capable of receiving a bit of data from an exterior environment via bit lines, storing the bit of data, and transmitting the bit of data back to the exterior environment via the bit line at a later time. In an array of nvSRAM cells, a group of eight bits, which is known as a byte of information, is transferred to and from the exterior environment by the bit lines and word lines that enable a particular group of eight nvSRAM cells to transfer a word of information to or from the exterior environment via the bit lines. It should be appreciated that the array can be configured to transfer larger or smaller groups of bits to and from the exterior environment. For example, four bits, which is known as a nibble, can be transferred to and from the exterior environment. As previously mentioned, the SRAM cell 12 requires power to retain a bit of data. If power is removed from the SRAM cell 12, the bit of data retained therein is lost.

The nvSRAM device 10 also includes an nv cell 14 that is capable of receiving a bit of data from the SRAM cell 12 in a store operation, retaining the bit of data even in the absence of power being provided to the nvSRAM device 10, and then transmitting the bit of data back to the SRAM cell 12 in a recall operation.

To provide power to the nvSRAM device 10, a power line 16 is provided for connecting the nvSRAM device 10 to a power supply 18 and a ground line 20 (Vssc) is provided for connecting the nvSRAM device to ground 22. The nvSRAM 10 is suited to use with a high voltage power supply, such as a 5 volt power supply, or a lower voltage power supply, such as a 3 volt power supply. Typically, power supplies are specified as operating within a range of voltages. For example, a 5 volt power supply provides power at a voltage that varies ±10%, i.e., between 4.5 volts and 5.5 volts. Consequently, the nvSRAM device 10 must be capable of operating within this voltage range. For convenience, the range specifiers are hereinafter omitted from the voltage specification of the power supply 18. For example, a 3 volt ±10% power supply will be referred to as a 3 volt power supply. It should also be understood at this point that when the voltage being provided by the power supply 18 nears or goes below the lower end of the range, the nvSRAM device 10 must consider a complete power loss to be imminent and take the appropriate action to transfer the data in the SRAM cell 12 into the nv cell 14.

A controller 24 is included in the nvSRAM device 10 for: (1) providing signals to SRAM cell 12 to transfer a bit of data between the SRAM cell 12 and the exterior environment; (2) providing signals to the SRAM cell 12 and the nv cell 14 to copy a bit of data from the SRAM cell 12 into the nv cell 14, i.e. cause a store operation to be performed; and (3) providing signals to the SRAM cell 12 and the nv cell 14 to copy a bit of data from the nv cell 14 to the SRAM cell 12, i.e. cause a recall operation to be performed. The controller 24 performs the noted operations based upon signals received from a device, typically a microprocessor, that is located exterior to the nvSRAM device 10. For example, if a microprocessor required the bit of data stored in the SRAM 12, it would issue a command to the controller 24. In response, the controller 24 would provide the signals to the SRAM cell 12 to cause the bit of data in the SRAM cell 12 to be transferred to the exterior environment. The microprocessor can also request a store or recall operation. The controller also performs certain operations without direction from a microprocessor. For instance, the controller 24 is capable of independently sensing when power is initially being applied to the device 10 and, in response, causing a recall operation (power-up recall operation) to be performed. Conversely, the controller 24 is capable of sensing when power is being removed from the device 10 and, in response, causing a store operation (power-down store operation) to be performed.

With the foregoing general description of the nvSRAM device 10 in mind, the nvSRAM device 10 is now described in greater detail. Generally the nvSRAM device 10 is comprised of a number of n-channel, Field-Effect Transistors (FETs) and resistors. It should, however, be appreciated that other types of transistors, such as p-channel FETs, bipolar transistors, and combinations of different types of transistors can be utilized.

The SRAM cell 12 includes a first SRAM FET 26A and a second SRAM FET 26B that are in a 1-bit latch configuration in which the drain of each FET is coupled to the gate of the other FET and the source of one FET is coupled to the source of the other FET. In the latch configuration, the first and second SRAM FETs 26A, 26B operate as switches that are either in an ON state an OFF state. More specifically, the latch operates so that when one of the first and second SRAM FETs 26A, 26B is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET 26A in an ON state and the second SRAM FET 26B in an OFF state.

Conversely, if the bit of data is in a 1 state, the latch can represent the 1 state of the bit by placing the first SRAM FET 26A in an OFF state and a second SRAM FET 26B in an ON state.

The SRAM cell 12 further includes first and second pull-up resistors 28A, 28B to aid the first and second SRAM FETs 26A, 26B in latching a bit of data from the nv cell 14 or from the exterior environment. The first pull-up resistor 28A is located between the drain of the first SRAM FET 26A, which is identified as node 30A, and a line that carries a $V_{ccl}$ voltage signal, a voltage signal internal to the chip that is substantially equal to the voltage provided by the external power supply 18. Similarly, the second pull-up resistor 28B is located between node 30B and the line that carries the $V_{ccl}$ voltage signal. There are a number of alternatives to the use of pull-up resistors. For example, depletion n-channel FETs or cross-coupled p-channel FETs can be utilized.

Also included in the SRAM cell 12 are first and second transfer FETs 32A, 32B for transferring a bit of data between the latch formed by the first and second SRAM FETs 26A, 26B and the exterior environment. The gate of each of the first and second transfer FETs 32A, 32B is connected to a word line WL; the drains of the first and second transfer FETs 32A, 32B are respectively connected to nodes 30A, 30B; and the sources of the first and second transfer FETs 32A, 32B are respectively connected to bit lines BLT and BLC. The first and second transfer FETs 32A, 32B function as switches that are placed in an ON state to transfer a bit of data between the latch and the exterior environment and otherwise placed in an OFF state. The state of the first and second transfer FETs (ON or OFF) is controlled by a signal applied to the word line WL. If the first and second transfer FETs 32A, 32B are in an ON state, a bit of data can be transferred between the latch and the exterior environment via the bit lines BLT and BLC.

The nv cell 14 includes a first silicon nitride oxide semiconductor (SNOS) FET 36A and a second SNOS FET 36B for respectively storing the state of the first SRAM FET 26A and the second SRAM FET 26B. The state of the first and second SRAM FETs 26A, 26B is stored in the first and second SNOS FETs 36A, 36B by forcing, in a store operation, the threshold voltages for turning ON the first and second SNOS FETs 36A, 36B to reflect the states of the first and second SRAM FETs 26A, 26B. For example, if the first SRAM FET 26A is in an OFF state and the second SRAM FET 26B is in an ON state, the store operation would reflect this state of the first and second SRAM FETs 26A, 26B by forcing the threshold voltage for turning ON the first SNOS FET 36A to be more negative than the threshold voltage for turning on the second SNOS FET 36B. It should be appreciated that the SNOS FETs can be replaced with other types of transistors that also have adjustable threshold voltages, such as silicon oxide nitride oxide semiconductor transistors (SONOS), floating gate transistors and ferroelectric transistors appropriately connected for a shadow RAM.

The nv cell 14 further includes a first store FET 38A and a second store FET 38B that operate as switches during store and recall operations to appropriately configure the nv cell 12 for the transfer of a bit of data between the SRAM cell 12 and the nv cell 14. More specifically, the first and second store FETs 38A, 38B function to connect the nv cell 14 to the SRAM cell 12 during store and recall operations and to otherwise disconnect the nv cell 14 from the SRAM cell 12. The state of the first and second store FETs 38A, 38B is controlled by a $V_{STR}$ signal that is applied to the gates of the FETs. More specifically, if the $V_{STR}$ signal is LOW, the first and second store FETs 38A, 38B are turned OFF to disconnect the nv cell 14 from the SRAM cell 12. Conversely, if the $V_{STR}$ signal is HIGH, the first and second store FETs 38A, 38B are turned ON to connect the nv cell 14 to the SRAM cell 12.

The nv cell 14 further includes a first recall FET 40A and a second recall FET 40B that also functions as switches to place the nv cell 14 in the appropriate configuration for transferring a bit of data between the SRAM cell 12 and the nv cell 14 during store and recall operations. More specifically, the first and second recall FETs 40A, 40B function to connect the nv cell 14 to the power supply 18 during a recall operation and to disconnect the nv cell 14 from the power supply 18 during a store operation and otherwise. The state of the first and second recall FETs 40A, 40B is controlled by a $V_{RCL}$ signal that is applied to the gates of the FETs. More specifically, if the $V_{RCL}$ signal is low, the first and second recall FETs 40A, 40B are turned OFF to disconnect the nv cell 14 from the power supply 18. Conversely, if the $V_{RCL}$ signal is HIGH, the first and second recall FETs 40A, 40B are turned ON to connect the nv cell 14 to the power supply 18.

Figure 2:
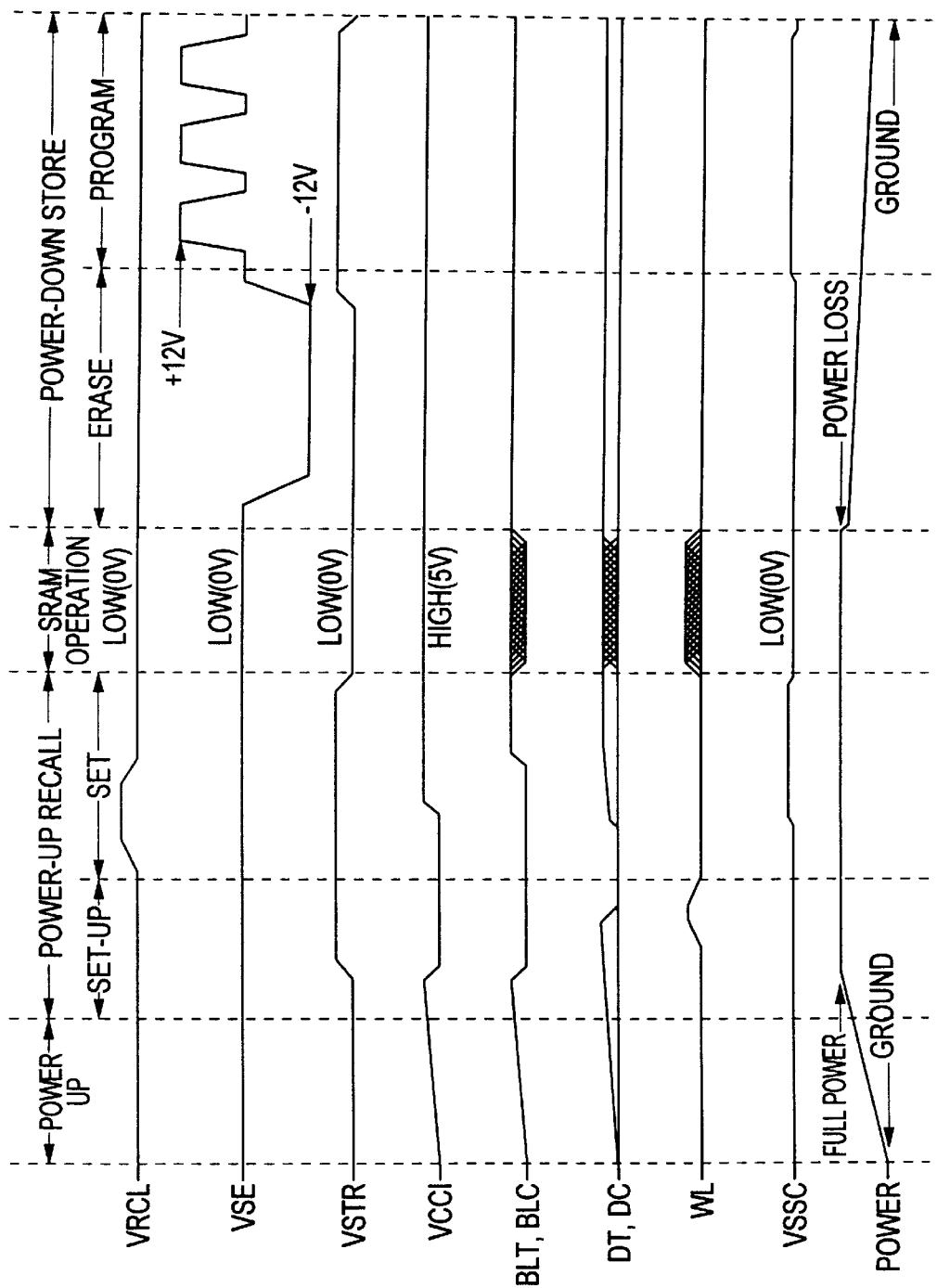
FIG. 2 is a prior art timing diagram of the various signals applied by the controller to the memory cell shown in FIG. 1 during the power-up recall and power-down store operations that transfer a bit of data between the SRAM cell and the nv cell, and during SRAM operations that result in a bit of data being transferred between the SRAM cell and the exterior environment.

With reference to FIG. 2, the recall operation and prior store operation are described. More specifically, the recall operation that occurs upon the controller 24 detecting that power is being provided to the nvSRAM 10, i.e., a power-up recall, and the prior store operation that occurs upon the controller 24 detecting a potential loss of power. Lastly, the operation of the SRAM cell in transferring a bit of data to/from the exterior environment is described with respect to FIG. 2 for complete the high speed store the high speed store operation will be discussed.

The power-up recall operation commences upon the controller 24 detecting that the power being provided to the nvSRAM 10 has transitioned a threshold. The power-up recall involves a set-up phase in which the SRAM cell 12 is placed in a condition that assures that a bit of data can be transferred from the nv cell 14 to the SRAM cell 12 and a set phase in which the bit of data resident in the nv cell 14 is copied into the SRAM cell 12. At the beginning of the set-up phase, the controller 24 establishes: (1) Vrcl in a LOW condition to disconnect the nv cell 14 from the power supply 18; (2) Vstr in a LOW condition to disconnect the nv cell 14 from the SRAM cell 12; (3) Use is grounded; (4) WL is in a LOW condition; (5) Vssc in a LOW condition; (6) Vcci in a HIGH condition; and (7) BLT and BLC in a HIGH condition. Subsequently, the controller 24 places Vstr in a HIGH condition to connect the nv cell 14 to the SRAM cell 12. Further, the controller 24 places Vcci, BLT and BLC in a LOW condition to remove power from the SRAM cell 12 and to isolate the voltages at nodes 30A, 30B. At this point, the controller 24 cycles WL to discharge nodes 30A, 30B and thereby place both of the nodes 30A, 30B in a LOW condition. Thus, the SRAM cell 12 is a known condition that will not interfere with the transfer of a bit of data from the nv cell 14 to the SRAM cell 12.

At the beginning of the set phase of the power-up recall operation, the controller 24 causes $V_{RCL}$ to transition from a LOW condition to a HIGH condition to turn ON both the first and second recall FETs 40A, 40B and thereby connect the nv cell 14 to the power supply 18. After Vrcl has entered the HIGH condition, the controller 24 causes the $V_{CCI}$ signal to transition from the LOW condition to the HIGH condition thereby applying a voltage to the pull-up resistors 28A, 28B. As a result, the appropriate voltage is established between the gate and drain of one of the first and second SRAM FETs 26A, 26B to be turned ON while the other FET is left turned OFF. Thus, the bit of data that was stored in the nv cell 14 is transferred to the SRAM cell 12.

The prior store operation of the nvSRAM device 10 includes an erase phase and a program phase. During the erase phase, the controller 24 places the first and second SNOS FETs 36A, 36B in a known state so that they can be subsequently programmed to reflect the state of the first and second SRAM FETs 26A, 26B. At the start of the erase phase, the controller 24 places: (1) $V_{RCL}$ in a LOW condition to turn OFF the first and second recall FETs 40A, 40B and thereby disconnect the nv cell 14 from the power supply 18; (2) Vstr in a LOW condition to turn OFF the first and second store FETs 38A, 38B and thereby disconnect the nv cell 14 from the SRAM cell 12; (3) Vse at the ground voltage, i.e. 0 volts; (4) Vcci, BLT and BLC in a HIGH condition; and (5) WL and Vssc in a LOW condition. Next, the controller transitions the $V_{SE}$ from ground to a large negative voltage (referred to as an erase voltage) to place the first and second SNOS FETs 36A, 36B in a known condition. Towards the end of the erase phase, the controller 24 raises the Vstr signal from the LOW condition to a HIGH condition to connect the SRAM cell 12 to the nv cell 14. At about the same time, the controller 24 causes the Vse signal to transition from the large negative voltage to ground. The erase phase takes approximately 6.5–8 ms to complete.

With continued reference to FIG. 2, the program phase commences with Vstr in a HIGH condition, Vrcl in a LOW condition and Vse at ground. The controller 24 does not change the state of the Vcci, BLT, BLC or WL relative to the erase portion. However, Vssc is increased to approximately 1.2 volts to increase the field isolation when there is a high voltage running between the transistors associated with the nv cell 14. Subsequently, the controller 24 cycles the Vse between ground and a large positive voltage (referred to as a program voltage) to establish different threshold levels in the first and second SNOS FETs 36A, 36B that reflect the state of the first and second SRAM FETs 26A, 26B of the SRAM cell 12. At the end of the program phase, the controller 24 causes: (1)$V_{SE}$ to transition from 12 volts, the program voltage, to ground; and (2) $V_{STR}$ to transition from the HIGH state to the LOW state to turn OFF the first and second store FETs 38A, 38B, thereby disconnecting the nv cell 14 from the SRAM cell 12. The program phase takes approximately 1.5–2 ms to complete.

In transferring a bit of data between the SRAM cell 12 and the exterior environment, the controller 24: (1) place Vrcl, Vse and Vstr in a LOW condition to isolate the nv cell 14 from the power supply 18 and the SRAM cell 12; (2) places Vcci in a HIGH condition to provide power to the SRAM cell 12; and (3) uses BLT, BLC and WL to effect the transfer of a bit of data between the SRAM cell 12 and the exterior environment.

The high speed store operation performs the erase phase of the store operation described with respect to FIG. 2 prior to the detection of a probable loss of power by the controller 24. This pre-arms the nvSRAM device 10 so that when a probable power loss is detected by the controller 24 the power-down store operation only involves performance of the program phase, rather than the more time consuming performance of both the erase phase and program phase. Since the erase phase is no longer part of the power-down store operation, the erase phase is hereinafter referred to as the erase operation to reflect this separate status.

Figure 3:
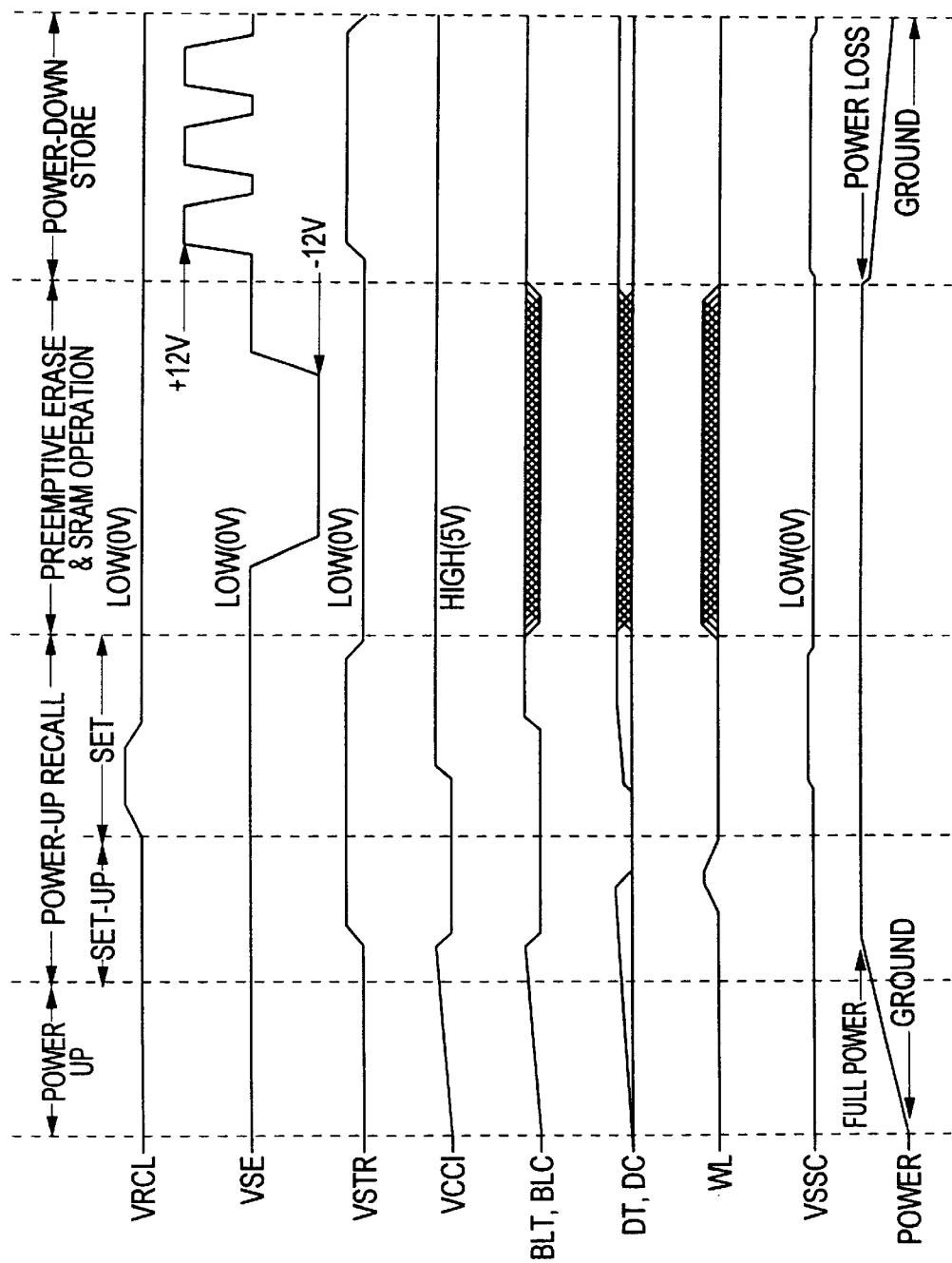
FIG. 3 is a timing diagram illustrating an erase operation during SRAM operations to prepare the non-volatile portion of the nvSRAM for a subsequent, high-speed store operation.

With reference to FIG. 3, one implementation of a high speed store operation is described. In this implementation, the controller 24 issues the signals to cause the performance of an erase operation: (1) prior to the detection of a potential loss of power; (2) subsequent to a power-up recall; and (3) during the time that the nvSRAM device 10 is capable of transferring a bit of data between the SRAM cell 12 and the exterior environment. As previously noted, this pre-arms the nv cell 14 so that when a probable loss of power is subsequently detected by the controller 24, the ensuing power-down store operation simply involves implementation of the program phase. The signals issued by the controller 24 to implement the erase operation during the time when SRAM operations are possible are substantially the same as described with respect to FIG. 2. One difference, however, is that the controller 24 holds Vstr LOW during the entire time that SRAM operations are possible and brings Vstr HIGH only after a probable loss of power is detected.

The signals issued by the controller 24 to cause the program phase (i.e. to cause the high speed power-down store) to be performed subsequent to the detection of a probable loss of power are substantially the same as noted with respect to FIG. 2. The exception is that the controller 24 must now bring Vstr HIGH subsequent to the detection of a probable loss of power.

It should also be noted that an advantage of performing the erase operation during the time when SRAM operations are possible is that many systems in which the nvSRAM device 10 is used only proceed with SRAM operations when the power supply is stable. A stable power supply provides substantial assurance that the erase operation can be completed prior to a power loss. The presence of a stable power supply is typically indicated to the nvSRAM device 10 by a device exterior to the nvSRAM device 10, such as a microprocessor. This indication typically involves the exterior device toggling a write enable signal that is provided to the chip within which the nvSRAM device 10 is located. It is also feasible to use other signals or combinations of signals to indicate that the power supply is stable.

Another advantage associated with performing the erase operation during the time when SRAM operations are possible is that the erase operation is transparent to the user, i.e., the erase operation does not require any accommodation by the system within which the nvSRAM is integrated.

Figure 4:
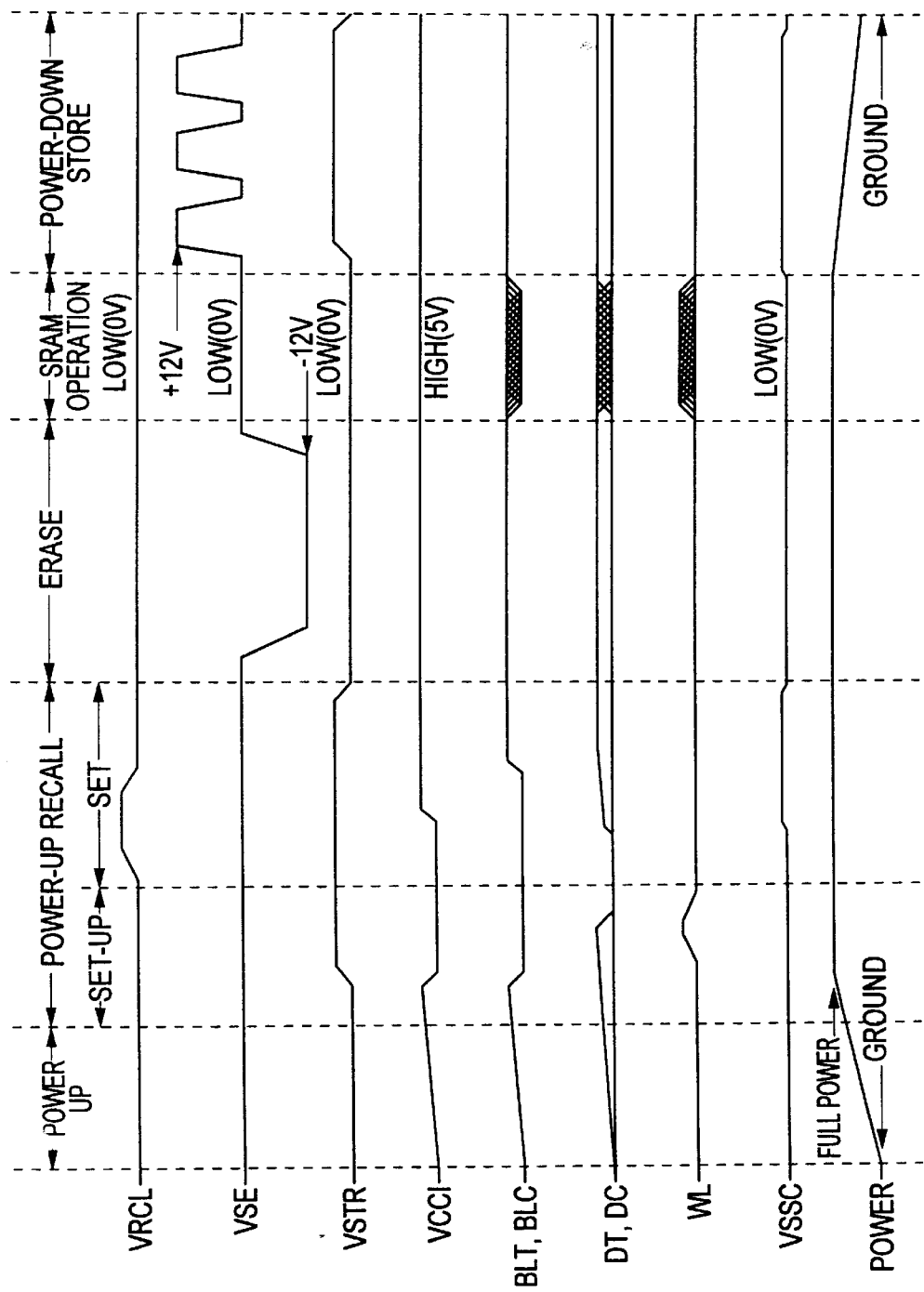
FIG. 4 is a timing diagram illustrating an erase operation following a power-up recall and prior to SRAM operations to prepare the non-volatile portion of the nvSRAM for a subsequent, high-speed store operation.

With reference to FIG. 4, a second implementation of a high speed store operation is described. In this implementation, the controller 24 issues the signals to cause the performance of an erase operation: (1) prior to the detection of a possible loss of power; (2) subsequent to a power-up recall; and (3) prior to the time that the nvSRAM device 10 is capable of transferring a bit of data between the SRAM cell 12 and the exterior environment. Again, this pre-arms the nv cell 14 so that when a probable loss of power is subsequently detected by the controller 24, the ensuing power-down store operation simply involves implementation of the program phase. The signals issued by the controller 24 to implement the erase operation during this time period are substantially the same as described with respect to FIG. 2. One difference, however, is that the controller holds Vstr LOW during the entire erase operation and brings Vstr HIGH only after a probable loss of power is detected. The signals issued by the controller 24 to cause the program phase (i.e. to cause the high speed power-down store) to be performed subsequent to the detection of a probable loss of power are substantially the same as noted with respect to FIG. 2. The exception is that the controller 24 must now bring Vstr HIGH subsequent to the detection of a probable loss of power. The erase operation is shown as occurring immediately after the power-up recall. At this point in time it is reasonable to assume that the power supply is stable and that there will be sufficient time to complete the erase operation before a loss of power. Nonetheless, it is also feasible to defer the erase operation until there is a confirmation of the stability of the power supply. For instance, the erase operation can be deferred until the write enable signal is toggled or some other indication of power supply stability is provided.

Notably, the high speed power-down store operation is performed in 1.5–2 ms, i.e., the time required to perform a program operation. This is significantly less than the 8–10 ms of the prior store operation.

The high speed power-down store makes the nvSRAM device 10 particularly useful with low voltage power supplies, such as 3 V power supplies, which typically provide less time to store valuable data in the event of a power loss than higher voltage power supplies, such as 5 V supplies. It should also be noted that if the high speed store operation is completed, the nvSRAM device 10 is capable of retaining the bit of data that has been transferred from the SRAM cell 12 to the nv cell 14 for a period of time on the order of 100 years. If, however, there is insufficient power to complete the high speed store operation, the retention period is diminished. Nonetheless, if as little as 750 microseconds of the high speed store operation is completed, retention on the order of 10 years is attained.

Also provided is an nvSRAM that provides for independent erase and/or store operation. Stated differently, the nvSRAM provides for the decoupling of the erase and store operations, i.e., permitting one or the other of these operations to be independently performed. To elaborate, presently a store operation necessarily follows an erase operation. In certain applications, an erase operation without a subsequent store operation is desirable. For example, in certain security or confidential information type applications, it is desirable to erase the data in the nv cell and use a loss of power to erase any data in the SRAM cell to prevent any data in either the nv cells or SRAM cells from coming into the possession of certain parties.

An independent erase operation is accomplished by the controller 24 issuing signals to the nvSRAM device 10 as previously described. The independent erase operation can be accomplished at any time following a power-up recall. To elaborate, the independent erase operation can be accomplished: (a) prior to the period during which SRAM operations can occur (FIG. 4); (b) during the period of time during which SRAM operations can occur (FIG. 3); and (c) subsequent to a loss of power (FIG. 2).

In the event that an independent erase operation has been performed, a subsequent store operation is not precluded. However, the subsequent store operation must be independently initiated. Consequently, a further embodiment of the nvSRAM provides for an independent store operation following an independent erase operation.

An independent store operation is accomplished by the controller 24 issuing signals to the nvSRAM device 10 as previously described. The independent store operation can only be accomplished at particular times following a power-up recall. To elaborate, the independent store operation can be accomplished: (a) prior to the period during which SRAM operations can occur (FIG. 4); (b) during the period of time during which SRAM operations can occur (FIG. 3) but only when an SRAM is not occurring; and (c) subsequent to a loss of power (FIG. 2).

A number of modifications are possible. For instance, while the controller 24 is shown as being integrated onto the same chip as the nvSRAM cell or cells, the controller 24 can also be implemented separately from the nvSRAM cells. Further, the controller 24 and/or nvSRAM cells can be integrated onto a chip that includes other componentry, such as logic circuits and microcontrollers.

The foregoing description of the invention has been presented for purposes of illustration and description. Further, the description is not intended to limit the invention to the form disclosed herein. Consequently, variations and modification commensurate with the above teachings, and the skill or knowledge in the relevant art are within the scope of the present invention. The preferred embodiment described hereinabove is further intended to explain the best mode known of practicing the invention and to enable others skilled in the art to utilize the invention required by their particular applications or uses of the invention. It is intended that the appended claims be construed to include alternate embodiments to the extent permitted by the prior art.

What is claimed is:

1. A non-volatile, static random access memory (nvSRAM) with high speed store on power down capability comprising:
   a memory cell comprising:
      a static random access memory that is capable of receiving a bit of data from an exterior environment, retaining said bit of data, and transmitting said bit of data to the exterior environment;
      wherein a bit of data stored in said static random access memory can be lost if power is removed from said static random access memory;
      a non-volatile memory, operatively connected to said static random access memory, that is capable of receiving a bit of data from said static random access memory prior to the possible removal of power from said memory cell, retaining said bit of data even after removal of power from said memory cell, and transmitting said bit of data back to said static random access memory when power is being provided to said memory cell;
      wherein the capability of said non-volatile memory to transmit a bit of data back to said static random access memory is a recall operation;
      wherein the capability of said non-volatile memory to receive a bit of data from said static random access memory is accomplished by a store operation;
      wherein an erase operation places said non-volatile memory in condition to receive a bit of data from said static random access memory during a store operation;
      wherein said erase operation precedes said store operation; a controller for issuing erase, store and recall operation related signals to said memory cell;
   wherein said controller is capable of issuing signals to said memory cell after a loss of power has been detected to cause said store operation to be preformed;
   wherein said controller is capable of issuing signals to said memory cell before a loss of power has been detected to cause the erase operation to be performed.

2. A non-volatile, static random access memory device, as claimed in claim 1, wherein:
   said controller is capable of issuing signals to said memory cell after a recall operation to cause said erase operation to be performed.

3. A non-volatile, static random access memory device, as claimed in claim 2, wherein:
   said controller is capable of issuing signals to said memory cell before a transfer of a bit of data between said static random access memory and the exterior environment to cause said erase operation to be performed.

4. A non-volatile, static random access memory device, as claimed in claim 1, wherein:
   said controller is capable of issuing signals to said memory cell to cause said erase operation to be performed during the time when a transfer of a bit of data between said static random access memory and the exterior environment can occur.

5. A non-volatile, static random access memory device, as claimed in claim 1, wherein:
   a store operation takes less than 8 milliseconds.

6. A non-volatile, static random access memory device, as claimed in claim 1, wherein:
   a store operation takes less than 2 milliseconds.

7. A non-volatile, static random access memory device, as claimed in claim 1, further comprising:
   means for receiving power from a power supply of less than 5 volts.

8. A non-volatile, static random access memory device, as claimed in claim 1, wherein:
   said memory cell and said controller are integrated onto a single chip.

9. A non-volatile, static random access memory device, as claimed in claim 8, further comprising:
   a number of said memory cell are integrated onto said single chip.

10. A non-volatile, static random access memory device, as claimed in claim 8, further comprising:
    at least one a microcontroller and a logic circuit integrated onto said single chip.

11. A non-volatile, static random access memory (nvSRAM) with high speed store on power down capability comprising:
    a memory cell comprising:
       a static random access memory that is capable of receiving a bit of data from an exterior environment, retaining said bit of data, and transmitting said bit of data to the exterior environment;
       wherein a bit of data stored in said static random access memory can be lost if power is removed from said static random access memory;
       a non-volatile memory, operatively connected to said static random access memory, that is capable of receiving a bit of data from said static random access memory prior to the possible removal of power from said memory cell, retaining said bit of data even after removal of power from said memory cell, and transmitting said bit of data back to said static random access memory when power is being provided to said memory cell;
       wherein the capability of said non-volatile memory to transmit a bit of data back to said static random access memory is a recall operation;
       wherein the capability of said non-volatile memory to receive a bit of data from said static random access memory is accomplished by store operation;
       wherein an erase operation places said non-volatile memory in condition to receive a bit of data from said static random access memory during a store operation;
       wherein said erase operation precedes said store operation;
    a controller for issuing erase, store and recall operation related signals to said memory cell;
    wherein said controller is capable of issuing signals to said memory cell after a loss of power has been detected to cause said store operation to be performed;
    wherein said controller is capable of issuing signals to said memory cell before a loss of power has been detected to cause the erase operation to be performed;
    wherein said controller is capable of issuing signals to said memory cell after a recall operation to cause the erase operation to be performed;
    wherein said controller is capable of issuing signals to said memory cell during the time when a transfer of a bit of data between said static random access memory and the exterior environment can occur to cause the erase operation to be performed.

12. A non-volatile, static random access memory (nvSRAM) with high speed store on power down capability comprising:
  a memory cell comprising:
    a static random access memory that is capable of receiving a bit of data from an exterior environment, retaining said bit of data, and transmitting said bit of data to the exterior environment;
    wherein a bit of data stored in said static random access memory can be lost if power is removed from said static random access memory;
    a non-volatile memory, operatively connected to said static random access memory, that is capable of receiving a bit of data from said static random access memory prior to the possible removal of power from said memory cell, retaining said bit of data even after removal of power from said memory cell, and transmitting said bit of data back to said static random access memory when power is being provided to said memory cell;
    wherein the capability of said non-volatile memory to transmit a bit of data back to said static random access memory is a recall operation;
    wherein the capability of said non-volatile memory to receive a bit of data from said static random access memory is accomplished by store operation;
    wherein an erase operation places said non-volatile memory in condition to receive a bit of data from said static random access memory during a store operation;
    wherein said erase operation precedes said store operation;
  a controller for issuing erase, store and recall operation related signals to said memory cell;
  wherein said controller is capable of issuing signals to said memory cell after a loss of power has been detected to cause said store operation to be performed;
  wherein said controller is capable of issuing signals to said memory cell before a loss of power has been detected to cause the erase operation to be performed;
  wherein said controller is capable of issuing signals to said memory cell after a recall operation to cause the erase operation to be performed;
  wherein said controller is capable of issuing signals to said memory cell before a transfer of a bit of data between said static random access memory and the exterior environment to cause the erase operation to be performed.

13. A non-volatile, static random access memory (nvSRAM) with independent erase control comprising:
  a memory cell comprising:
    a static random access memory that is capable of receiving a bit of data from an exterior environment, retaining said bit of data, and transmitting said bit of data to the exterior environment;
    wherein a bit of data stored in said static random access memory can be lost if power is removed from said static random access memory;
    a non-volatile memory, operatively connected to said static random access memory, that is capable of receiving a bit of data from said static random access memory prior to the possible removal of power from said memory cell, retaining said bit of data even after removal of power from said memory cell, and transmitting said bit of data back to said static random access memory when power is being provided to said memory cell;
    wherein the capability of said non-volatile memory to transmit a bit of data back to said static random access memory is a recall operation;
    wherein the capability of said non-volatile memory to receive a bit of data from said static random access memory is accomplished by a store operation;
    wherein an erase operation places said non-volatile memory in condition to receive a bit of data from said static random access memory during a store operation;
    wherein said store operation is preceded by an erase operation;
  a controller for issuing erase, store and recall operation related signals to said memory cell;
  wherein said controller is capable of issuing signals to cause an independent erase operation to be performed that is not necessarily followed by said store operation.

14. A non-volatile, static random access memory, as claimed in claim 13, wherein:
  said controller is capable of issuing signals to cause said independent erase operation to be performed in response to a request originating in the exterior environment.

15. A non-volatile, static random access memory, as claimed in claim 13, wherein:
  said controller is capable of issuing said signals to cause said independent erase operation to be performed after a recall operation.

16. A non-volatile, static random access memory, as claimed in claim 13, wherein:
  said controller is capable of issuing said signals to cause said independent erase operation to be performed after a recall operation and during the time when a transfer of a bit of data between said static random access memory and the exterior environment can occur.

17. A non-volatile, static random access memory, as claimed in claim 13, wherein:
  said controller is capable of issuing said signals to cause said independent erase operation to be performed after a recall operation and before the time when a transfer of a bit of data between said static random access memory and the exterior environment can occur.

18. A non-volatile, static random access memory, as claimed in claim 13, wherein:
  said controller is capable of issuing signals to cause said independent store operation to be performed in response to a request originating in the exterior environment.

19. A non-volatile, static random access memory, as claimed in claim 13, wherein:
  said controller is capable of issuing signals to cause an independent store operation to be performed following said independent erase operation.

* * * * *